United States Patent [19]
Fandrich

[11] Patent Number: 5,377,199
[45] Date of Patent: Dec. 27, 1994

[54] BOUNDARY TEST SCHEME FOR AN INTELLIGENT DEVICE

[75] Inventor: Mickey L. Fandrich, Placerville, Calif.

[73] Assignee: Intel Corporation, Santa Clara, Calif.

[21] Appl. No.: 85,644

[22] Filed: Jun. 30, 1993

[51] Int. Cl.$^5$ .......................................... G01R 31/28
[52] U.S. Cl. .................................................. 371/22.3
[58] Field of Search .................... 371/22.3, 22.1, 22.5; 324/158 R

[56] References Cited

U.S. PATENT DOCUMENTS 5,285,153  2/1994  Ahanin et al. ................. 324/158 R
5,341,380  8/1994  Shoda ............................... 371/22.3

Primary Examiner—Charles E. Atkinson
Attorney, Agent, or Firm—Blakely, Sokoloff, Taylor & Zafman

[57] ABSTRACT

A testing apparatus for testing connectivity to a circuit board of an integrated circuit chip disposed on the circuit board. The circuit board has signal transmission circuitry. The integrated circuit chip has pins coupled to the signal transmission circuitry. The pins are for receiving digital signals asserted external to the chip. Each digital signal has a binary value depending upon whether the signal is asserted or not. The testing apparatus tests connectivity of the pins. The testing apparatus has signal assertion and reception circuitry that is coupled to the signal transmission circuitry of the circuit board but is not disposed on the chip. Command sensing, pin state storage, general storage, algorithm execution and general data output circuitry are all disposed on the chip to be tested. The command sensing circuitry is for sensing external assertion of a test command by the signal assertion and reception circuitry. The test command causes the chip to enter a test mode. The pin state storage circuitry is coupled to the pins and stores the binary values associated with the signals asserted by the signal assertion and reception circuitry. The general storage circuitry is for storing general digital data. The algorithm execution circuitry executes a test algorithm if the chip has entered the test mode. The test algorithm retrieves the binary values stored in the pin state storage circuitry, converts the binary values to general digital data, and stores the general digital data in the general storage circuitry. The general digital data output circuitry provides the general digital data stored in the general storage circuitry as output from the chip to the signal assertion and reception circuitry after the test algorithm has executed.

32 Claims, 4 Drawing Sheets

BOUNDARY TEST SCHEME FOR AN INTELLIGENT DEVICE

FIELD OF THE INVENTION

The present invention relates to computer memory cards. More specifically, the present invention implements a method and apparatus for testing the connectivity of individual memory units of a card.

BACKGROUND OF THE INVENTION

Random access memory (RAM) in the form of memory cards have been used with computers. Typically, a memory card will be populated by several integrated circuit (IC) chips, each chip being a random access memory unit. In the past, the random access memory integrated circuits were generally either dynamic random access memory (DRAM) or static random access memory (SRAM). Both DRAM and SRAM are well known in the art to be forms of volatile memory. DRAM and SRAM have a relatively fast access time when compared to non-volatile memory devices such as a hard drive.

Frequently, when the memory card is populated by the memory chips, the chips are soldered into place on a printed circuit board (PCB) of the memory card. During the soldering process, an integrated circuit chip can be damaged. Also, one or more of the soldered connections may be defective. There are basically two types of defective soldered connections. In the first type, an open condition occurs such that there is no electrical connection from a pin of the integrated circuit chip to the board. In the second type of solder defect, a short exists such that two or more pins are connected together electrically. If an integrated circuit has been damaged, or a solder defect has occurred, the memory card will not function properly. Therefore, it is desirable to have a method to test the connectivity of each pin of an integrated circuit to the memory bard. Such a test is commonly called a boundary scan test because the pins of the integrated circuit form the boundary of the circuit through which the integrated circuit interfaces with the memory card.

In the case of DRAM and SRAM, a boundary scan can be performed quickly using a programmable tester and testing methods that are well known in the art. In a typical boundary scan test, the memory card is inserted into a testing unit. The testing unit sets all of the memory units to a known state; for example, storing all zeros or all ones. Next, the tester will pick an area of interest on one of the memory units and write a pattern to that area of into;rest. The tester then reads the area of interest to compare the pattern written to the pattern read. If the pattern written does not match the pattern read, then a first type of defect has been found. The tester then reads all other areas of the memory unit, and of the other memory units, to see if the known state of these areas has changed. If the known state has changed, then a second type of defect has been found. The tester then writes another pattern to the area of interest. Typically, the first pattern will be a checkerboard pattern (e.g. 010101...) and the second pattern will be a complement checkerboard pattern (e.g. 101010...). The second pattern is then read back and compared to verify that the second pattern was stored properly. All of the other areas of the memory unit and the other memory units are again checked to verify that storing the second pattern has not changed the known state of these areas.

Once the first area of interest of the first chip has been tested, a new area of interest is selected and the test process outlined above is repeated until the entire first chip has been tested. Each of the other chips of the card are also tested in a similar manner.

The above test procedure works well so long as the integrated circuit chips of the memory board being tested are SRAM or DRAM. This is because SRAM and DRAM chips may be read from, and written to, quickly. Memory cards have recently begun to be developed, however, that use flash memory integrated circuit chips rather than SRAM or DRAM. Like SRAM and DRAM, flash memory is a random access memory that can be read from quickly. Flash memory is non-volatile, however. Therefore, unlike SRAM and DRAM, flash memory retains the data stored within it after power has been removed from the memory. Also, unlike SRAM and DRAM, writing to, or clearing, flash memory takes a relatively long amount of time. This is because the flash memory must be programmed through a series of write cycles in order to achieve non-volatility.

Performing a traditional boundary scan test on a memory card that is populated with flash memory chips takes a relatively long time because of the need to perform many time consuming writes to the chip and also to perform many time consuming clearing operations. An alternative way to perform a boundary scan on a memory card populated with flash memory chips would be to add JTAG boundary scan pins and circuitry to each chip. A JTAG boundary scan is well known in the art. In a JTAG scan, test circuitry and five extra (JTAG) pins are added to each chip. The JTAG pins for each chip are then connected in series, and a series of commands are issued through the pins to the test circuitry on-board the chips to read back data and verify that the interconnections have been properly made. Details of the JTAG boundary scan may be found in the IEEE 1149.1 standard (IEEE Press, 1991).

JTAG boundary scan testing is commonly used to test chips such as microprocessors. To perform a JTAG test, however, one must add five extra pins and additional circuitry to the integrated circuit chip to be tested. Adding extra pins and circuitry required for a JTAG boundary scan is not acceptable in the case of integrated circuit memory chips. This is because to add JTAG would unacceptably increase the complexity and cost of the memory chips. For example, a memory chip typically has on the order of 50 pins, therefore, the addition of five JTAG pins would increase the number of pins for the chip by approximately 10 per cent.

SUMMARY AND OBJECTS OF THE INVENTION

One objective of the present invention is to implement a boundary scan test for intelligent chips such as flash memory chips.

Another objective of the present invention is to significantly reduce the boundary scan test time for intelligent chips.

Another objective of the present invention is to minimize the amount of additional boundary scan circuitry that must be added to an intelligent chip to be tested.

Another objective of the present invention is to permit a boundary scan of an intelligent chip to be performed without adding special boundary scan pins.

These and other objects of the invention are provided for by a testing method and apparatus for testing connectivity to a circuit board of an integrated circuit chip disposed on the circuit board. The circuit board has signal transmission circuitry. The integrated circuit chip has pins coupled to the signal transmission circuitry. The pins are for receiving digital signals asserted external to the chip. Each digital signal has a binary value depending upon whether the signal is asserted or not. The testing apparatus has signal assertion and reception circuitry that is coupled to the signal transmission circuitry of the circuit board but is not disposed on the chip.

Command sensing, pin state storage, general storage, algorithm execution and general data output circuitry are all disposed on the chip to be tested.

The command sensing circuitry is coupled to the signal transmission circuitry. The command sensing circuitry is for sensing external assertion of a test command by the signal assertion and reception circuitry. The test command causes the chip to enter a test mode.

The pin state storage circuitry is coupled to the pins. The pin state storage circuitry is for storing the binary values associated with the signals asserted by the signal assertion and reception circuitry. The general storage circuitry is for storing general digital data.

The algorithm execution circuitry is coupled to the command sensing circuitry and to the pin sensing and general storage circuitry. The execution circuitry is for executing a test algorithm if the chip has entered the test mode. The test algorithm retrieves the binary values stored in the pin state storage circuitry, converts the binary values to general digital data, and stores the general digital data in the general storage circuitry.

The general digital data output circuitry is coupled to the command sensing circuitry and to the general storage circuitry. The general digital data output circuitry provides the general digital data stored in the general storage circuitry as output from the chip to the signal assertion and reception circuitry after the test algorithm has executed.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A method and circuitry is disclosed for implementing a boundary scan test for an intelligent integrated circuit.

Figure 1:
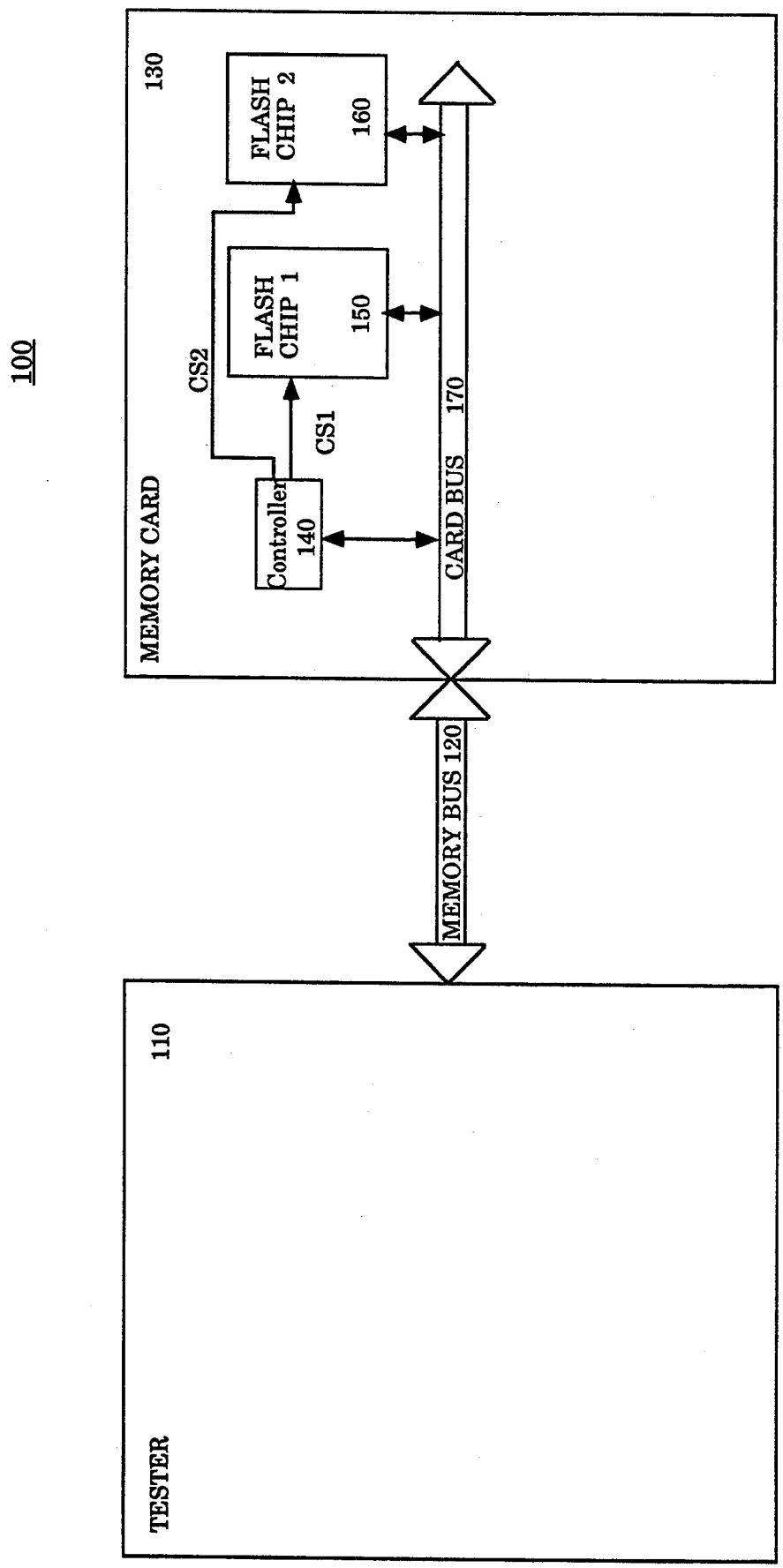
FIG. 1 illustrates a tester coupled under test by way of a memory bus to a memory card.

FIG. 1 illustrates a tester coupled to a memory card to be tested. In FIG. 1, memory card 130 is populated by flash memory integrated circuit chips 1 and 2, (150 and 160, respectively). Memory card 130 is also coupled to tester 110 by memory bus 120 so that a boundary scan test can be performed on memory card 130 by tester 110.

In FIG. 1, it can be seen that flash chips 150 and 160 are coupled to card bus 170. Card bus 170 is in turn coupled via memory bus 120 to tester 110. In the embodiment depicted in FIG. 1, a controller 140 is also coupled directly to card bus 170 and coupled to flash chips 150 and 160 by chip select signal lines CS1 and CS2, respectively. In this embodiment, controller 140 monitors card bus 170. When a read or write command is asserted by tester 110 on card bus 170, controller 140 determines whether the read or write command is meant for flash chip 150 or 160 and asserts the appropriate chip select signal. Alternately, controller 140 need not reside on memory card 130. In this alternate embodiment, the information required to select a particular chip is provided from memory bus 120 to card bus 170.

Tester 110 can be a dedicated device developed especially for testing memory card 130. Alternately, tester 110 can be a programmable general purpose computer of a kind that is readily available commercially. Furthermore, although the embodiments are discussed in the context of a memory card 130 populated by two flash chips, the teachings apply to any number of flash chips populating a memory card. Alternately, the teachings extend beyond memory cards populated by flash chips to boundary scan tests for any type of intelligent chip. For example, an intelligent chip is any type of chip that can perform the boundary scan algorithm as set forth below, either through the use of general purpose logic, or through the use of dedicated logic.

Figure 2:
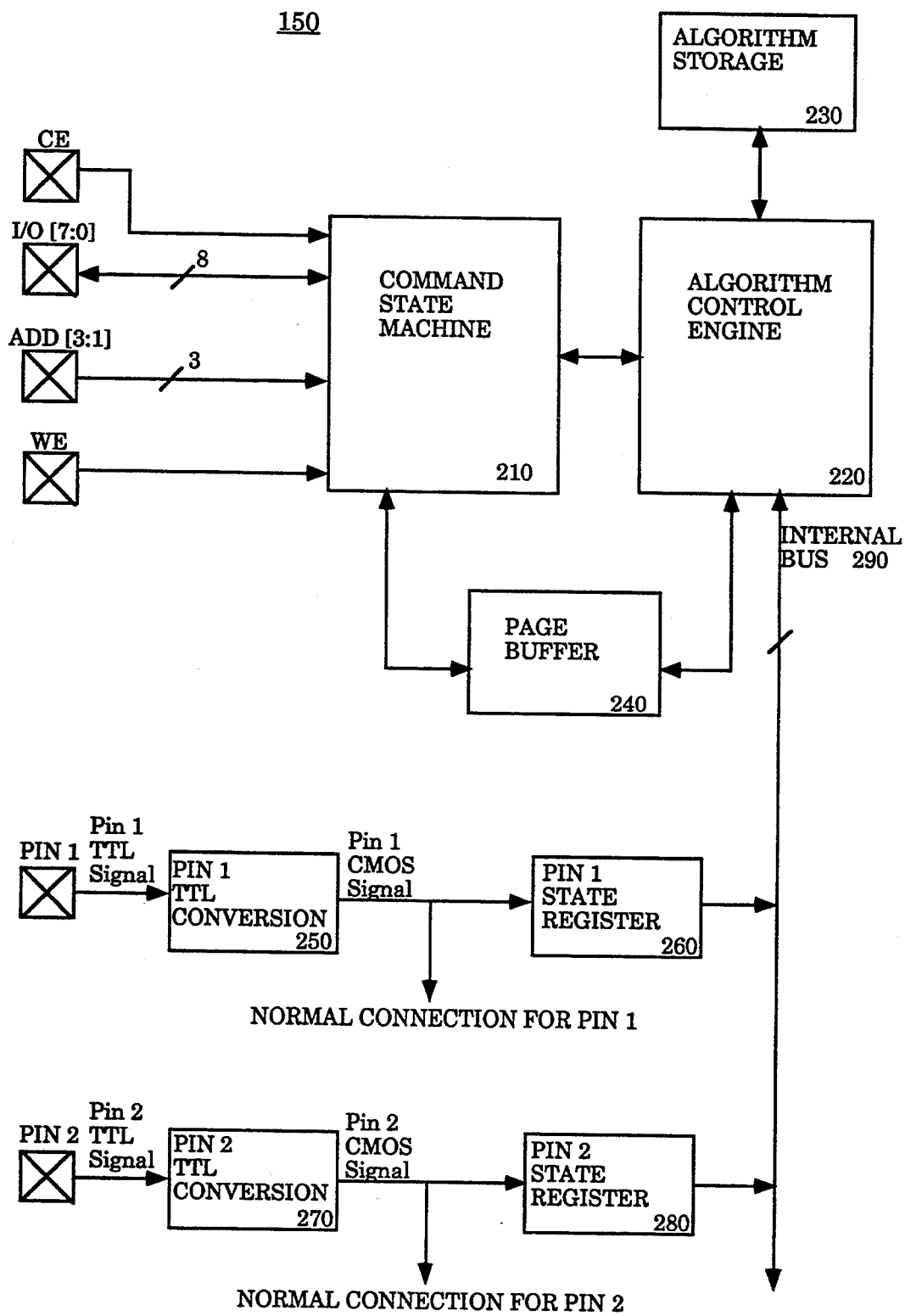
FIG. 2 illustrates an embodiment of boundary test circuitry.

Referring now to FIG. 2, one embodiment of circuitry for performing a boundary scan test in a flash memory is depicted. With the exception of pin 1 state register 260 and pin 2 state register 280, all circuitry depicted in FIG. 2 would usually be included in the flash memory to provide normal functionality.

In order for a boundary scan test technique to function properly, a subset of the pins of the chip must be properly connected. In the embodiment depicted in FIG. 2, the minimal subset of pins required by the test is comprised of: eight input/output pins, I/O [7:0]; three address pins, ADD [3:1]; a chip enable pin, CE; and a write enable pin, WE. The requirement that these 13 pins function properly in order to perform the boundary scan test is not as onerous as it may first appear. For example, a JTAG test may not be performed unless the five JTAG pins are functioning properly. Provided that the minimal set of pins is operating properly, functionality of the other pins on the boundary of the chip may be tested. In FIG. 2, pins 1 and 2 represent pins that are to be tested using one embodiment of a boundary scan test scheme. Although only two pins are represented in FIG. 2, alternatively, any number of pins can be tested.

As can be seen in FIG. 2, the minimum set of pins are each coupled to command state machine 210. Command state machine 210, in turn, is coupled to page buffer 240 and to algorithm control engine 220. Algorithm control engine 220 is further coupled to algorithm storage area 230. Algorithm control engine 220 is also coupled via internal bus 290 to pin 1 and 2 state registers, 260 and 280, respectively.

During normal operation of the flash memory unit, algorithm control engine 220 executes algorithms that are stored in algorithm storage area 230 when ordered to do so by command state machine 210. During execution of algorithms by algorithm control engine 220, information is stored in page buffer 240 and internal bus 290 is used to set and read internal registers (not shown) as the algorithm is executed. Examples of algorithms that would be executed by algorithm control engine 220 include a "program" algorithm for writing data to the flash memory and a "clear" algorithm for erasing data.

In one embodiment, commands can be entered to program algorithms stored in algorithm storage area 230. Commands are entered to command state machine 210 through pins I/O [7:0]. Because there are 8 bit lines in I/O [7:0], up to 256 different commands may be entered in this manner. In this embodiment, I/O pins [7:0] are multiplexed so that once a command is entered, they may be used to read and write data to and from the command state machine 210. Alternatively, these pins need not be multiplexed, and separate data and command pins can be used. To do so, however, would increase the minimum number of pins required to perform the boundary scan test.

Pin CE is a chip select pin. Each chip has its own chip select line. It is used to notify the memory chip that signals asserted on the other pins are intended for that chip.

Pin WE is a write enable pin. It is used to notify the command state machine that a command has been placed on I/O pins [7:0], or later, that an address has been entered on address pins ADD [3:1].

Pins 1 and 2 are representative of pins that are to be tested by the boundary scan test. Examples of pins 1 and 2 include address and data pins beyond those required for the minimum test set. During normal operation of the flash memory, a TTL (transistor-transistor logic) signal is asserted on a pin. Therefore, using pin 1 as an example, asserting pin 1 will cause a pin 1 TEL signal to be provided to pin 1 TTL conversion unit 250. In conversion unit 250, the TEL signal is converted to a CMOS (complex metal-oxide silicate) signal to be used internally in the flash memory. The CMOS signal is then provided to the normal connection for pin 1.

In one embodiment, however, the CMOS signal also sets a one bit pin 1 state register 260. State register 260 is coupled to the internal bus 290 used by the algorithm control engine 220. In a like manner, asserting pin 2 causes a TTL signal to be provided to pin 2 TTL conversion unit 270. Pin 2 TEL conversion unit 270, in turn, provides a pin 2 CMOS signal as output to the normal connection for pin 2. The CMOS signal is also input to a one bit pin 2 state register 280. State register 280, in turn, is coupled to internal bus 290.

During a boundary scan test, the chip to be tested is selected by asserting a chip select signal onto pin CE. Then, an eight bit boundary scan command is asserted on pins I/O [7:0]. Pin WE is also asserted to notify the command state machine 210 that a command has been placed on the pins. Upon receiving the boundary scan command, command state machine 210 orders algorithm control engine 220 to execute a boundary scan algorithm stored in algorithm storage area 230.

The boundary scan algorithm is an elegant algorithm. In one implementation, the boundary algorithm waits a period of time for any signals asserted by the tester on the pins to be tested to stabilize and be stored in the corresponding pin state register. Then, the contents of the state register for each pin is read over internal bus 290 and stored in predetermined lines of page buffer 240.

Once the boundary scan command has been asserted by the tester and the signals for the pins to be tested have also been asserted, the tester waits a period of time sufficient for the algorithm to load the page buffer with the state register contents of the pins. Then, address lines ADD [3:1] are used by the tester to specify lines of the page buffer to be output on I/O pins [7:0]. In one implementation, each line of page buffer 240 is eight bits wide. Because eight lines can be addressed by ADD [3:1], up to 64 pins may be tested. In this way, the tester may retrieve the values of the signals as perceived by the flash memory and compare them to the actual values asserted. If the asserted and expected values match, then the chip will pass the boundary scan test. If, on the other hand, the asserted and expected values do not match, then the chip will fail the boundary scan test. By comparing the asserted values to the values read, the tester can isolate any defective pin connections.

Figure 3:
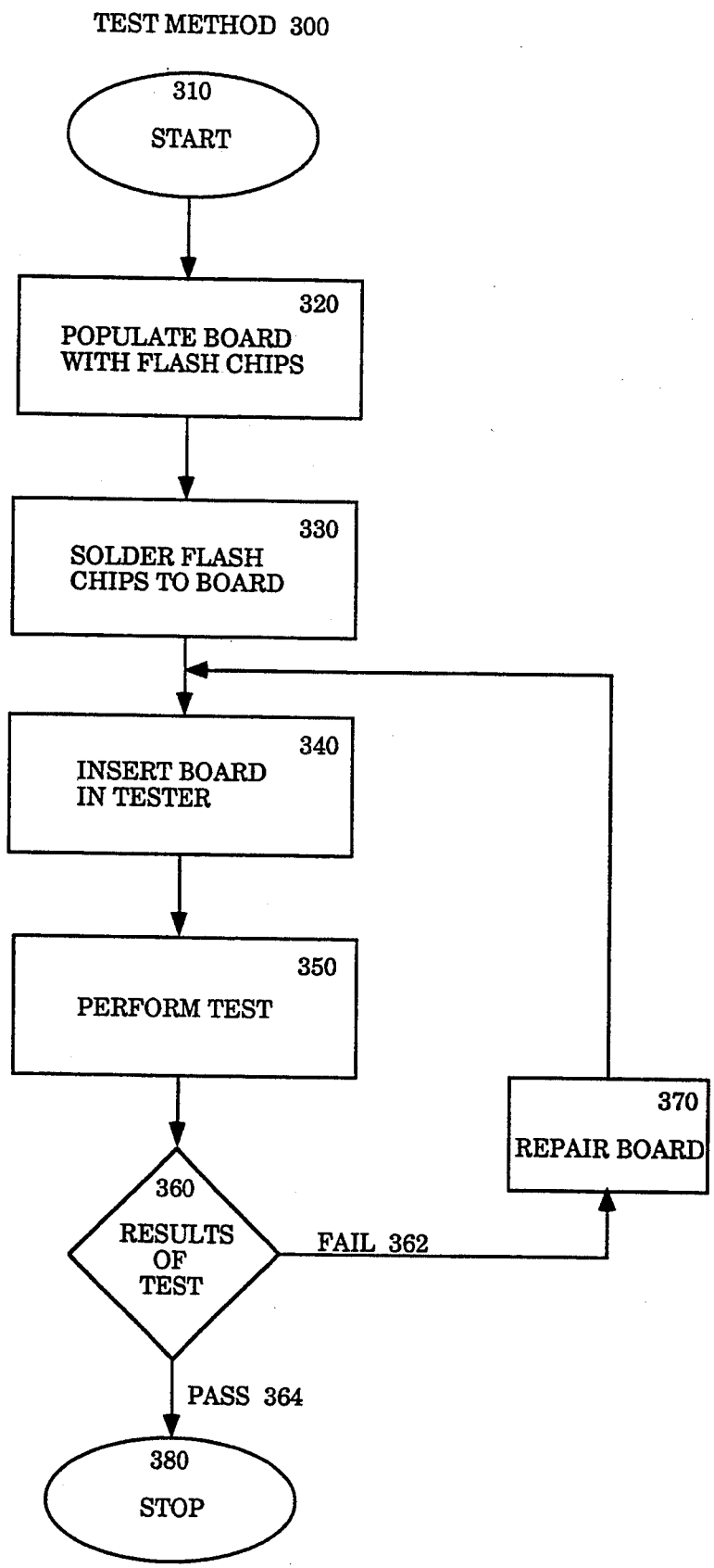
FIG. 3 illustrates a high level flow chart of a test method that may be employed by the circuitry depicted in FIG. 2.

Referring now to FIG. 3, a high level flow chart is depicted of one embodiment of a boundary scan test method. In FIG. 3, test method 300 begins at start bubble 310 and proceeds to process block 320 where the board to be tested is populated with flash chips. Once populated, the flash chips are soldered to the board in process block 330 and the board is inserted in the tester (process block 340) so that a boundary scan test can be performed (process block 350). After the test has been performed, the results of the test are analyzed in decision block 360. If the chip has passed the test, branch 364 is taken to terminal bubble 380 and the test stops. If, on the other hand, the board has failed the test, decision branch 362 is taken to process block 370 where the board is repaired. Once the board has been repaired, it can then be reinserted into the tester and the test performed again to verify that the repair worked.

Figure 4:
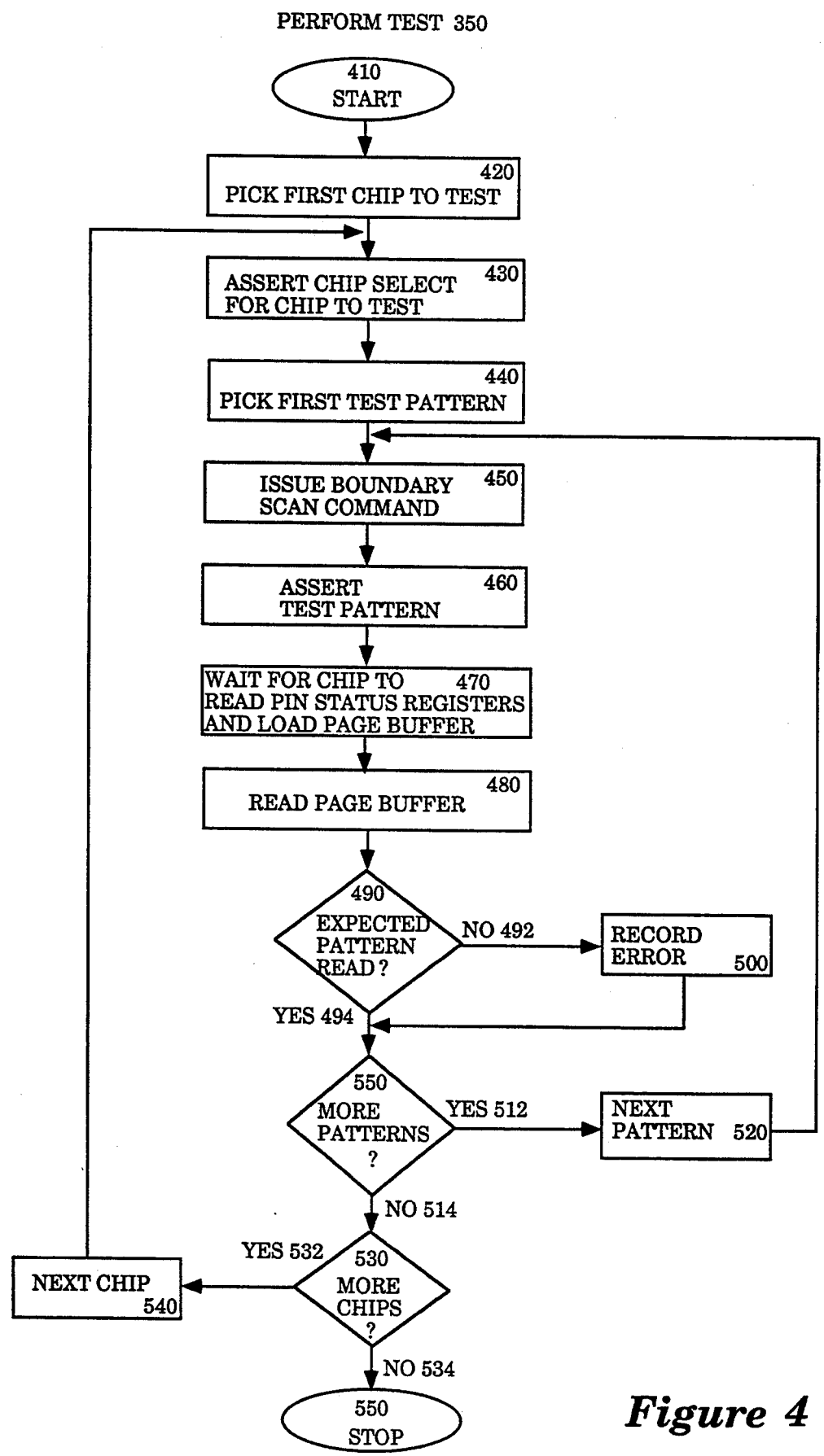
FIG. 4 illustrates a flow chart of a representative boundary scan test.

Referring now to FIG. 4, an expansion of the test algorithm of process block 350 of FIG. 3 is depicted. In FIG. 4, the perform test algorithm 350 starts at initial bubble 410 and proceeds to process block 420 where the first chip of the memory block to be tested is picked. Once the chip to be tested has been picked, the chip select for that chip is asserted in process block 430 and a first pattern to assert is selected in process block 440.

After the initial test pattern has been selected, the tester issues a boundary scan command (process block 450) and then asserts the test pattern (process block 460). Next, the tester waits for the chip to read the pin status registers and load the page buffer with the values of the pin status registers as depicted in process block 470. Once the page buffer has been loaded, the page buffer is read by the tester in process block 480 and a comparison is made in decision block 490 to determine whether the expected pattern was read. If the expected pattern was not read, then decision branch 492 is followed to process block 500 where the error is recorded. This information is later used when repairing the memory board. After recording the error, the test proceeds to decision block 550 to determine whether more patterns are to be tested. If, on the other hand, it is found in decision block 490 that the expected pattern was read, then decision branch 494 is taken directly to decision block 550 where a test is performed to see if more patterns are to be tested.

If more patterns are to be tested, then decision branch 512 is taken to process block 520 where the next pattern is selected. Processing then proceeds to process block 450 where the boundary scan command is once again issued. If, on the other hand, no more patterns are to be tested, then decision branch 514 is followed to decision block 530 where a test is performed to see if there are more chips on the memory board to be tested. If there are more chips to be tested, then decision branch 532 is taken to process block 540 where the next chip is selected. Processing then continues at processing block 430 where the chip select for the next chip to test is asserted. If, on the other hand, it is determined in decision block 530 that there are no more chips to select, then decision branch 534 is taken to terminal bubble 550 where the test terminates.

Thus, the described embodiments implement a boundary scan test for intelligent chips. As such, the described embodiments significantly reduce the boundary scan test time and minimizes the amount of additional circuitry that must be added to a chip to be tested. The described embodiments also permit a boundary scan to be performed without adding special boundary scan pins.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A testing apparatus for testing connectivity to a circuit board of an integrated circuit chip disposed on the circuit board, the apparatus comprising:
   signal transmission circuitry disposed on the circuit board;
   signal assertion and reception circuitry coupled to the signal transmission circuitry of the circuit board;
   command sensing circuitry disposed on the chip and coupled to the signal transmission circuitry, the command sensing circuitry for sensing external assertion of a test command by the signal assertion and reception circuitry, the test command causing the chip to enter a test mode;
   a plurality of test pins coupled to the signal transmission circuitry, the test pins for receiving digital signals asserted external to the chip, each digital signal of the digital signals having a binary value depending upon whether the signal is asserted or not;
   pin state storage circuitry disposed on the chip and coupled to the test pins, the pin state storage circuitry for storing the binary values associated with the signals asserted by the signal assertion and reception circuitry;
   general storage circuitry disposed on the chip, the general storage circuitry for storing general digital data;
   execution circuitry disposed on the chip and coupled to the command sensing circuitry and to the pin sensing and general storage circuitry, the execution circuitry for executing a test algorithm if the chip has entered the test mode, the test algorithm retrieving the binary values stored in the pin state storage circuitry, converting the binary values to the general digital data, and storing the general digital data in the general storage circuitry; and
   general digital data output circuitry disposed on the chip and coupled to the command sensing circuitry and to the general storage circuitry, the general digital data output circuitry for providing the general digital data stored in the general storage circuitry as output from the chip to the signal assertion and reception circuitry after the test algorithm has executed.

2. The apparatus as set forth in claim 1 wherein the execution circuitry can execute a plurality of algorithms, the test algorithm being one of the plurality of algorithms.

3. The apparatus as set forth in claim 2 wherein the execution circuitry is a general purpose processor and each algorithm of the algorithms can be modified programmably.

4. The apparatus as set forth in claim 2 wherein the general storage circuitry is a page buffer used by the execution circuitry when executing at least one of the plurality of algorithms.

5. The apparatus as set forth in claim 1 wherein the command sensing circuitry can sense a plurality of commands, the test command being one of the plurality of commands.

6. The apparatus as set forth in claim 5 wherein the execution circuitry can execute a plurality of algorithms, each of the plurality of algorithms having a corresponding command of the plurality of commands, each algorithm of the algorithms executing when the corresponding command is sensed by the command sensing circuitry, the test algorithm being one of the plurality of algorithms.

7. The apparatus as set forth in claim 1 wherein the apparatus further comprises command pins coupled to the command sensing circuitry and to the signal transmission circuitry, the test command being asserted on the command pins.

8. The apparatus as set forth in claim 1 wherein the apparatus further comprises data pins coupled to the general data output circuitry and to the signal transmission circuitry, the general digital data being asserted on the data pins by the general data output circuitry after the test algorithm has executed.

9. The apparatus as set forth in claim 1 wherein the apparatus further comprises data/command pins coupled to the command sensing circuitry, to the general data output circuitry and to the signal transmission circuitry, the test command being asserted on the data/command pins, the general digital data also being asserted on the data/command pins by the general data output circuitry after the test algorithm has executed.

10. The apparatus as set forth in claim 1 wherein the apparatus further comprises address pins coupled to the general data output circuitry and to the signal transmission circuitry, subsets of the general digital data being selectively asserted on the data pins by the general data output circuitry after the test algorithm has executed, the subset selection being made by the signal assertion and reception circuitry selectively asserting the address pins.

11. The apparatus as set forth in claim 1 wherein there are a plurality of the integrated circuit chips disposed on the circuit board, the apparatus further comprising chip selection circuitry coupled to the signal assertion and reception circuitry and to each of the chips, the chip selection circuitry for selecting a test chip of the plurality of chips to be tested by the connectivity test.

12. In an integrated circuit chip, an apparatus for testing connectivity, the apparatus comprising:
   command sensing circuitry for sensing external assertion of a test command, the test command causing the chip to enter a test mode;
   a plurality of test pins for receiving digital signals asserted external to the chip, each digital signal of the digital signals having a binary value depending upon whether the signal is asserted or not;

pin state storage circuitry coupled to the test pins, the pin state storage circuitry for storing the binary values associated with the signals;

general storage circuitry for storing general digital data;

execution circuitry coupled to the command sensing circuitry and to the pin sensing and general storage circuitry, the execution circuitry for executing a test algorithm if the chip has entered the test mode, the test algorithm retrieving the binary values stored in the pin state storage circuitry, converting the binary values to the general digital data, and storing the general digital data in the general storage circuitry; and general digital data output circuitry coupled to the command sensing circuitry and to the general storage circuitry, the general digital data output circuitry for providing the general digital data stored in the general storage circuitry as output frown the chip after the test algorithm has executed.

13. The apparatus as set forth in claim 12 wherein the execution circuitry can execute a plurality of algorithms, the test algorithm being one of the plurality of algorithms.

14. The apparatus as set forth in claim 13 wherein the execution circuitry is a general purpose processor and each algorithm of the algorithms can be modified programmably.

15. The apparatus as set forth in claim 13 wherein the general storage circuitry is a page buffer used by the execution circuitry when executing at least one of the plurality of algorithms.

16. The apparatus as set forth in claim 12 wherein the command sensing circuitry can sense a plurality of commands, the test command being one of the plurality of commands.

17. The apparatus as set forth in claim 16 wherein the execution circuitry can execute a plurality of algorithms, each algorithm of the plurality of algorithms having a corresponding command of the plurality of commands, each algorithm of the plurality of algorithms executing when the corresponding command is sensed by the command sensing circuitry, the test algorithm being one of the plurality of algorithms.

18. The apparatus as set forth in claim 12 wherein the apparatus further comprises command pins coupled to the command sensing circuitry, the test command being asserted on the command pins.

19. The apparatus as set forth in claim 12 wherein the apparatus further comprises data pins coupled to the general data output circuitry, the general digital data being asserted on the data pins by the general data output circuitry after the test algorithm has executed.

20. The apparatus as set forth in claim 12 wherein the apparatus further comprises data/command pins coupled to the command sensing circuitry and to the general data output circuitry, the test command being asserted on the data/command pins, the general digital data also being asserted on the data/command pins by the general data output circuitry after the test algorithm has executed.

21. The apparatus as set forth in claim 12 wherein the apparatus further comprises address pins coupled to the general data output circuitry, subsets of the general digital data being selectively asserted on the data pins by the general data output circuitry after the test algorithm has executed, the subset selection being made by selectively asserting the address pins externally.

22. In an integrated circuit chip, an apparatus for testing connectivity, the apparatus comprising:

a command sensor, if a test command is asserted externally to the chip, the command sensor causing the chip to enter a test mode;

a plurality of test pins for receiving digital signals asserted external to the chip, each digital signal of the digital signals having a binary value depending upon whether the signal is asserted or not;

pin state registers coupled to the test pins, the pin state registers storing the binary values associated with the signals;

general storage memory for storing general digital data;

a microprocessor coupled to the command sensor and to the pin state registers and general storage memory, the microprocessor executing a test algorithm if the chip has entered the test mode, the test algorithm retrieving the binary values stored in the pin state registers, converting the binary values to the general digital data, and storing the general digital data in the general storage memory; and general digital data driver coupled to the command sensor and to the general storage memory, the general digital data driver driving the general digital data stored in the general data memory as output from the chip after the test algorithm has executed.

23. The apparatus as set forth in claim 22 wherein the microprocessor can execute a plurality of algorithms, the test algorithm being one of the plurality of algorithms.

24. The apparatus as set forth in claim 23 wherein the microprocessor is a general purpose processor and each algorithm of the algorithms can be modified programmably.

25. The apparatus as set forth in claim 24 wherein the general memory is a page buffer used by the microprocessor when executing at least one of the plurality of algorithms.

26. The apparatus as set forth in claim 22 wherein the command sensor can sense a plurality of commands, the test command being one of the plurality of commands.

27. The apparatus as set forth in claim 26 wherein the microprocessor can execute a plurality of algorithms, each algorithm of the plurality of algorithms having a corresponding command of the plurality of commands, each algorithm of the algorithms executing when the corresponding command is sensed by the command sensor, the test algorithm being one of the plurality of algorithms.

28. The apparatus as set forth in claim 22 wherein the apparatus further comprises command pins coupled to the command sensor, the test command being asserted on the command pins.

29. The apparatus as set forth in claim 22 wherein the apparatus further comprises data pins coupled to the general data driver, the general digital data being asserted on the data pins by the general data driver after the test algorithm has executed.

30. The apparatus as set forth in claim 22 wherein the apparatus further comprises data/command pins coupled to the command sensor and to the general data driver, the test command being asserted on the data/command pins, the general digital data also being asserted on the data/command pins by the general data driver after the test algorithm has executed.

31. The apparatus as set forth in claim 22 wherein the apparatus further comprises address pins coupled to the general data driver, subsets of the general digital data being selectively asserted on the data pins by the general data driver after the test algorithm has executed, the subset selection being made by selectively asserting the address pins externally.

32. A method for testing connectivity of an integrated circuit chip, the method comprising:
- A) sensing external assertion of a test command, the test command causing the chip to enter a test mode;
- B) sensing test pins, the test pins for receiving digital signals asserted external to the chip, each digital signal of the digital signals having a binary value depending upon whether the signal is asserted or not;
- C) storing in pin state storage circuitry the sensed binary values associated with the signals;
- D) executing a test algorithm if the chip has entered the test mode, the test algorithm
    - i) retrieving the binary values stored in the pin state storage circuitry,
    - ii) converting the binary values to general digital data, and
    - iii) storing the general digital data in general storage circuitry; and
- E) providing the general digital data stored in the general storage circuitry as output from the chip after the test algorithm has executed.

* * * * *

UNITED STATES PATENT AND TRADEMARK OFFICE
CERTIFICATE OF CORRECTION

PATENT NO. : 5,377,199
DATED : December 27, 1994
INVENTOR(S) : Mickey L. Fandrich It is certified that error appears in the above-indentified patent and that said Letters Patent is hereby corrected as shown below:

In column 1 at line 39 delete "bard" and insert --board--

In column 1 at line 52 delete "into;rest" and insert --interest--

In column 5 at line 34 delete "TEL" and insert --TTL--

In column 5 at line 36 delete "TEL" and insert --TTL--

In column 5 at line 45 delete "TEL" and insert --TTL--

In column 9 at line 21 delete "frown" and insert --from--

Signed and Sealed this

Third Day of September, 1996

*Attest:*

BRUCE LEHMAN

*Attesting Officer*    Commissioner of Patents and Trademarks